(12) United States Patent
Maurelli

(10) Patent No.: US 6,451,653 B2
(45) Date of Patent: Sep. 17, 2002

(54) MANUFACTURING PROCESS FOR THE INTEGRATION IN A SEMICONDUCTOR CHIP OF AN INTEGRATED CIRCUIT INCLUDING A HIGH-DENSITY INTEGRATED CIRCUIT COMPONENTS PORTION AND A HIGH-PERFORMANCE LOGIC INTEGRATED CIRCUIT COMPONENTS PORTION

(75) Inventor: Alfonso Maurelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/858,335

(22) Filed: May 15, 2001

(30) Foreign Application Priority Data

May 15, 2000 (EP) .............................. 00201716

(51) Int. Cl.[7] ........................................... H01L 21/336
(52) U.S. Cl. ...................... 438/258; 438/241; 438/266; 257/326
(58) Field of Search ................................ 438/258, 241, 438/266; 257/314, 326, 315, 316

(56) References Cited

U.S. PATENT DOCUMENTS

| 5,783,471 | A | | 7/1998 | Chu ............................ 438/257 |
| 5,792,684 | A | * | 8/1998 | Lee et al. .................... 438/238 |
| 5,998,251 | A | * | 12/1999 | Wu et al. .................... 438/241 |
| 6,037,222 | A | * | 3/2000 | Huang et al. ................ 438/257 |
| 6,117,723 | A | * | 9/2000 | Huang ........................ 438/238 |

FOREIGN PATENT DOCUMENTS

| EP | 0 656 663 A2 | 6/1995 |
| EP | 0 811 983 A1 | 12/1997 |
| JP | 3-177065 | 8/1991 |
| WO | WO 98/44552 | 10/1998 |

* cited by examiner

Primary Examiner—David Nelms
Assistant Examiner—Tu-Tu Ho
(74) Attorney, Agent, or Firm—Lisa K. Jorgenson; Robert Iannucci; Seed IP Law Group, PLLC

(57) ABSTRACT

A process for the integration in a semiconductor chip of an integrated circuit including a high-density integrated circuit components portion and a high-performance logic integrated circuit components portion, providing for: over a semiconductor substrate, insulatively placing a silicidated polysilicon layer that includes a polysilicon layer selectively doped in accordance to a conductivity type of at least the high-performance logic integrated circuit components, covered by a silicide layer; selectively covering the silicidated polysilicon layer with a hard mask; defining gate structures for the high-density integrated circuit components and for the high-performance logic integrated circuit components using said hard mask, the gate structures comprising the silicidated polysilicon layer covered with the hard mask; in a dielectric layer formed over the chip, forming contact openings for electrically contacting the high-density integrated circuit components and the high-performance logic integrated circuit components, wherein at least the contact openings for electrically contacting the high-density integrated circuit components are formed in self-alignment with the gate structures thereof.

19 Claims, 13 Drawing Sheets

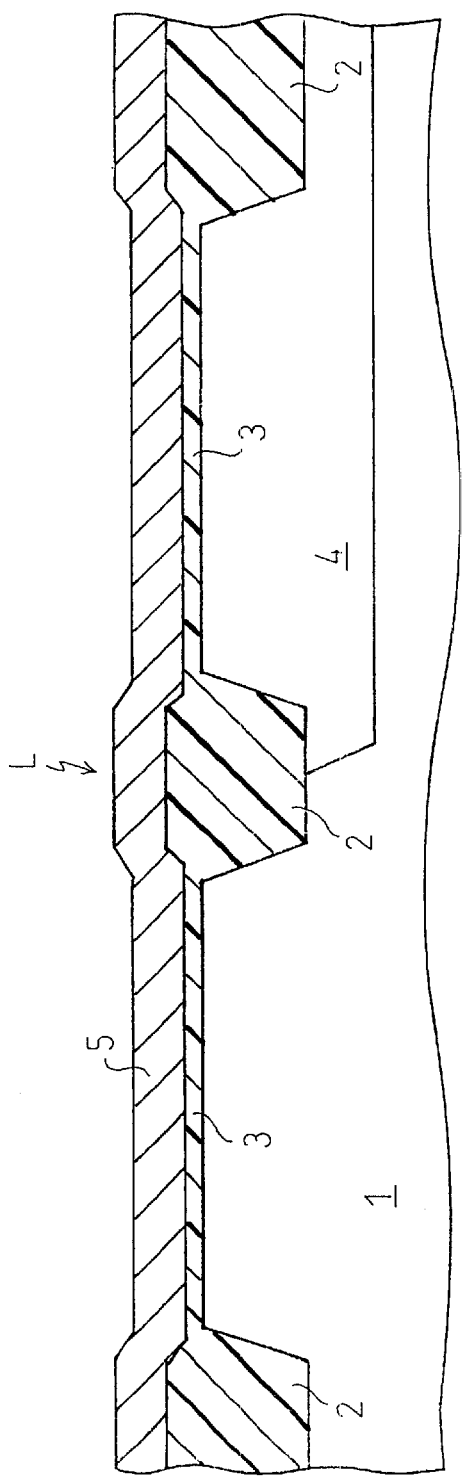
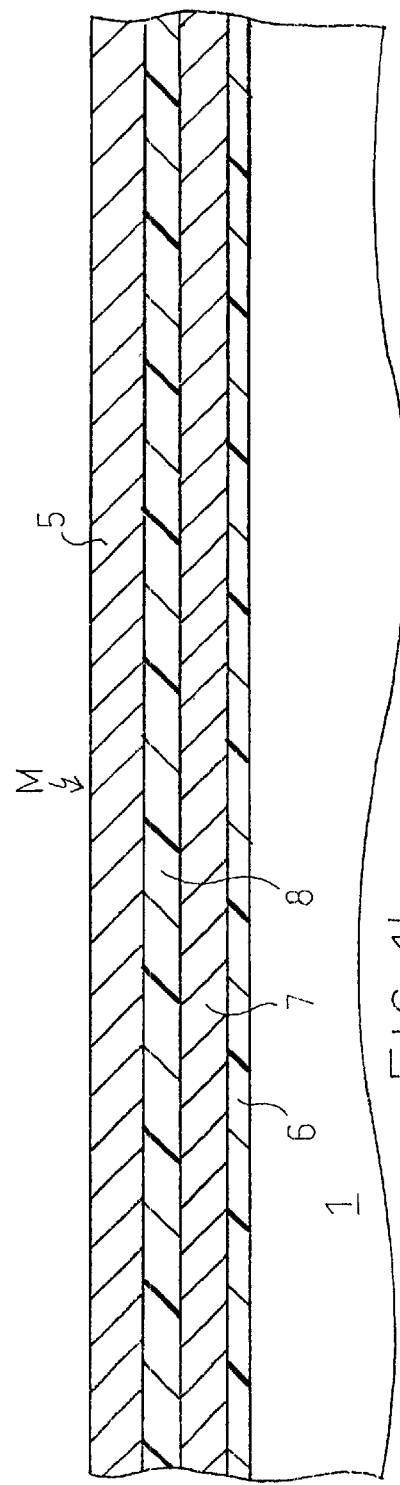
FIG.1a
FIG.1b

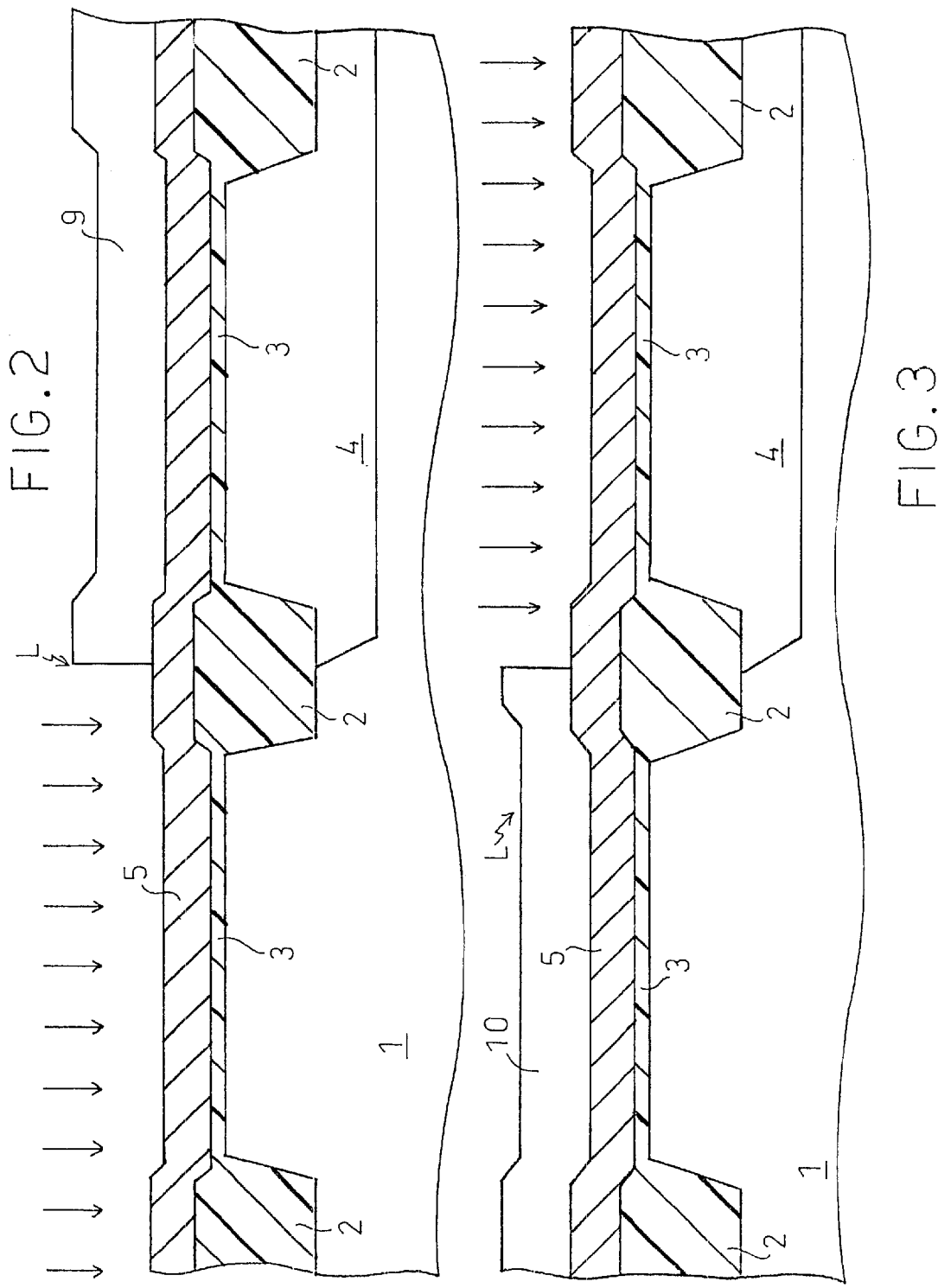

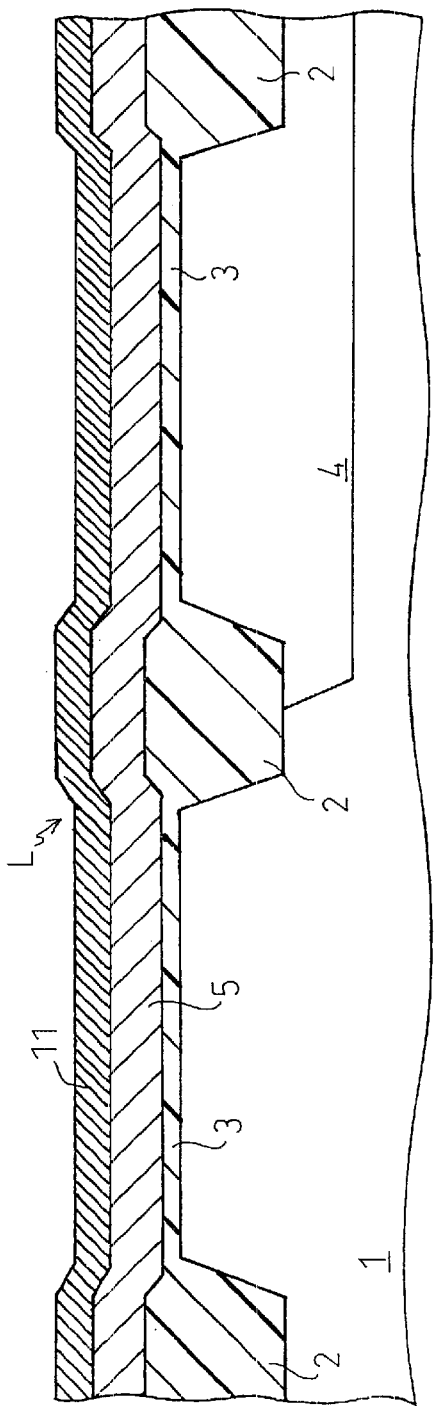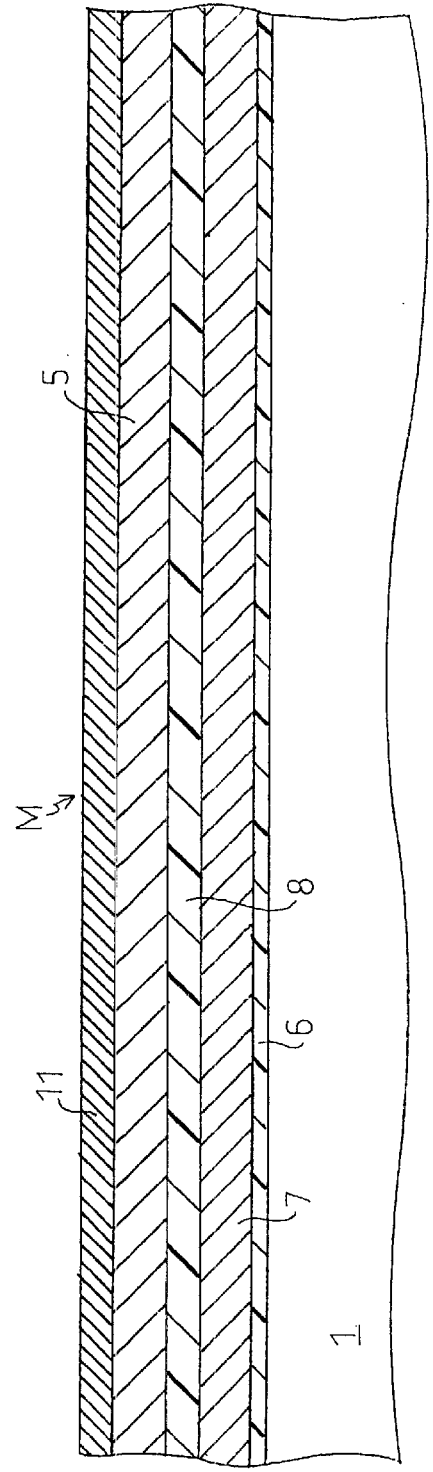

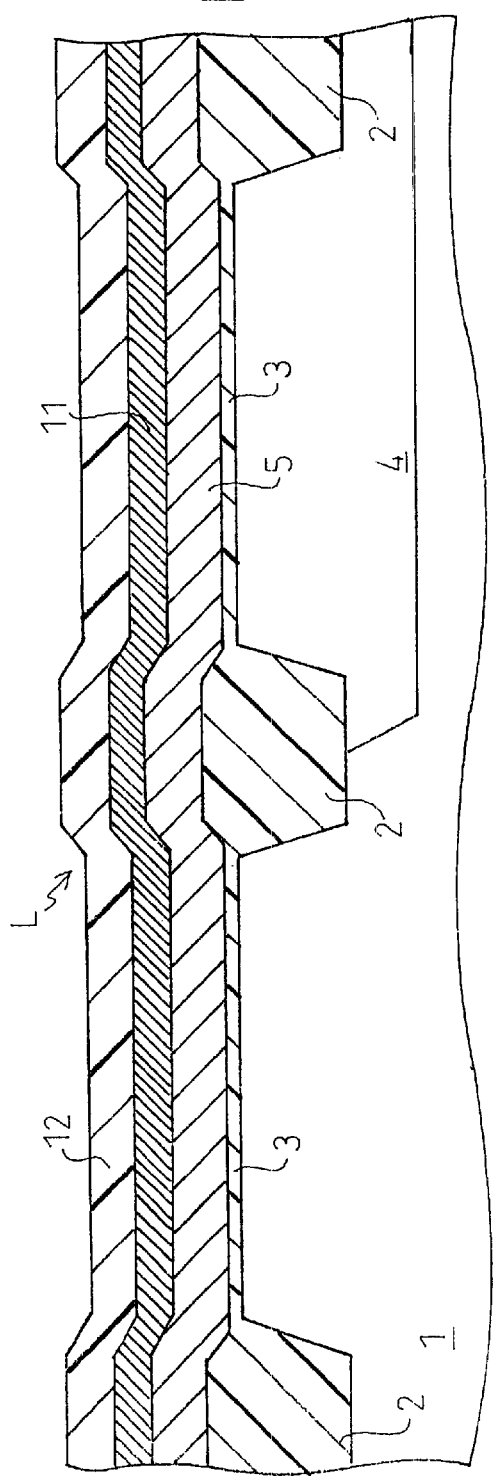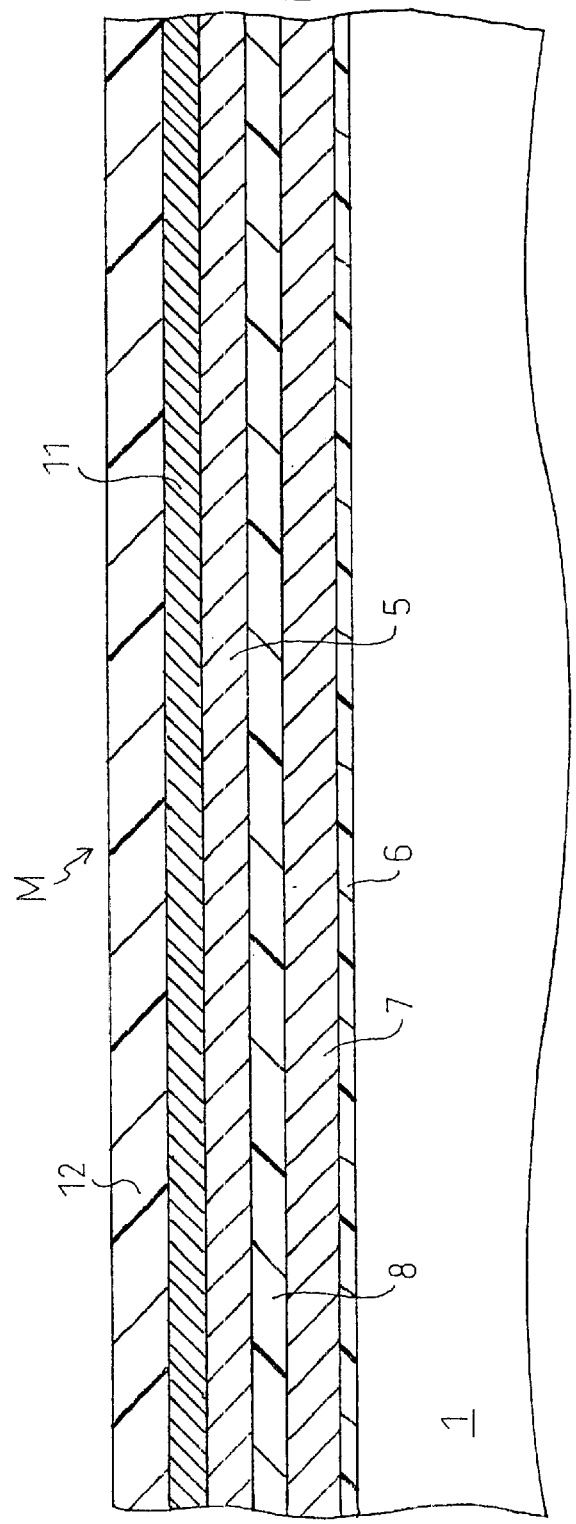

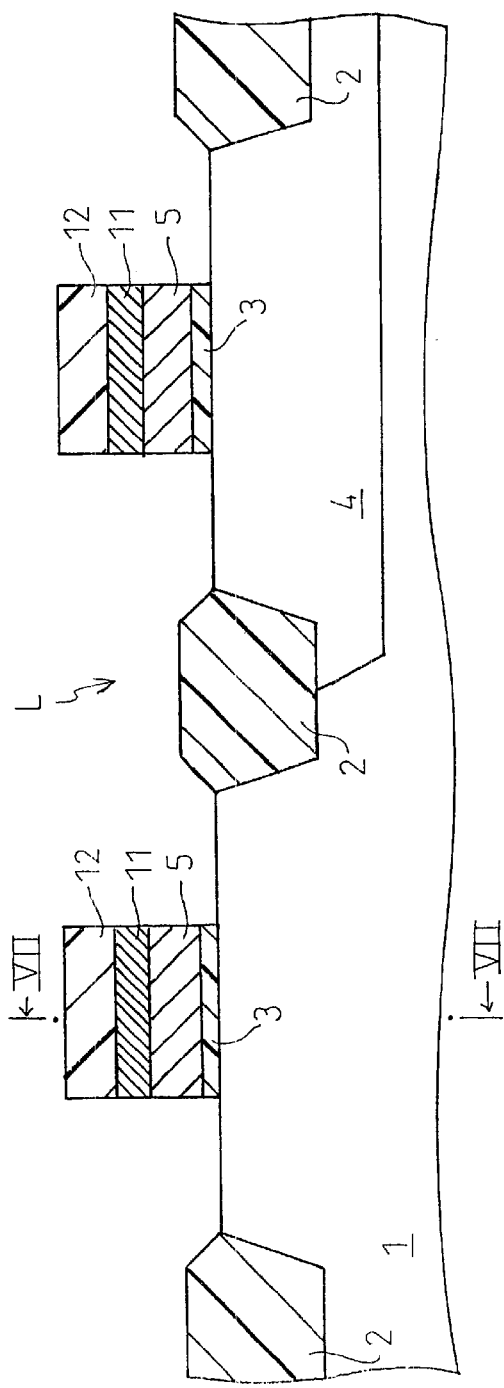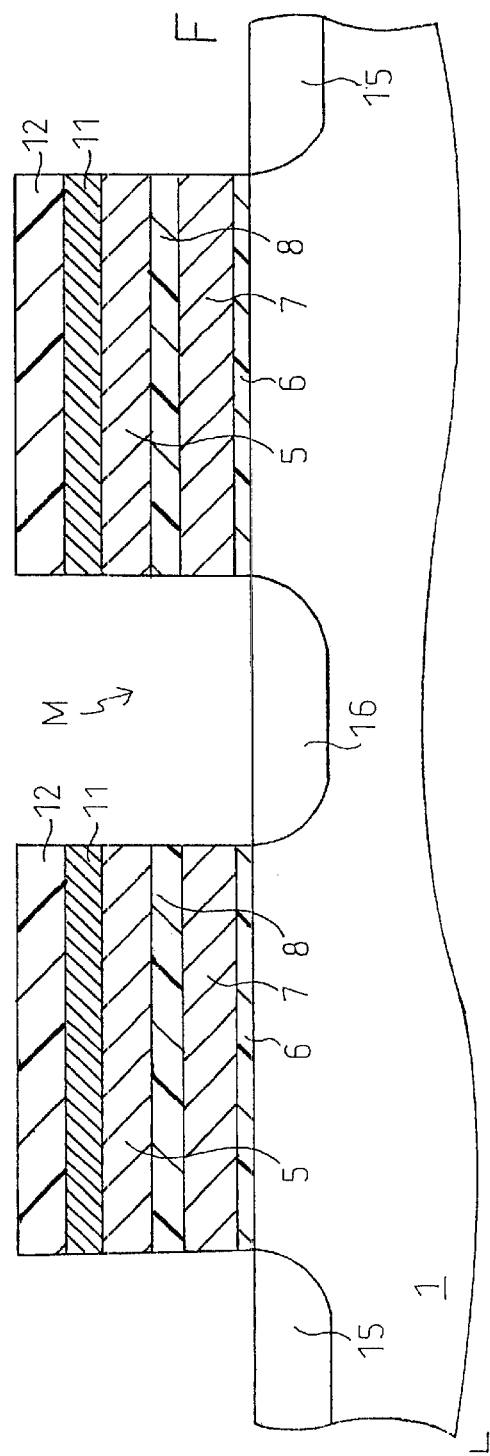

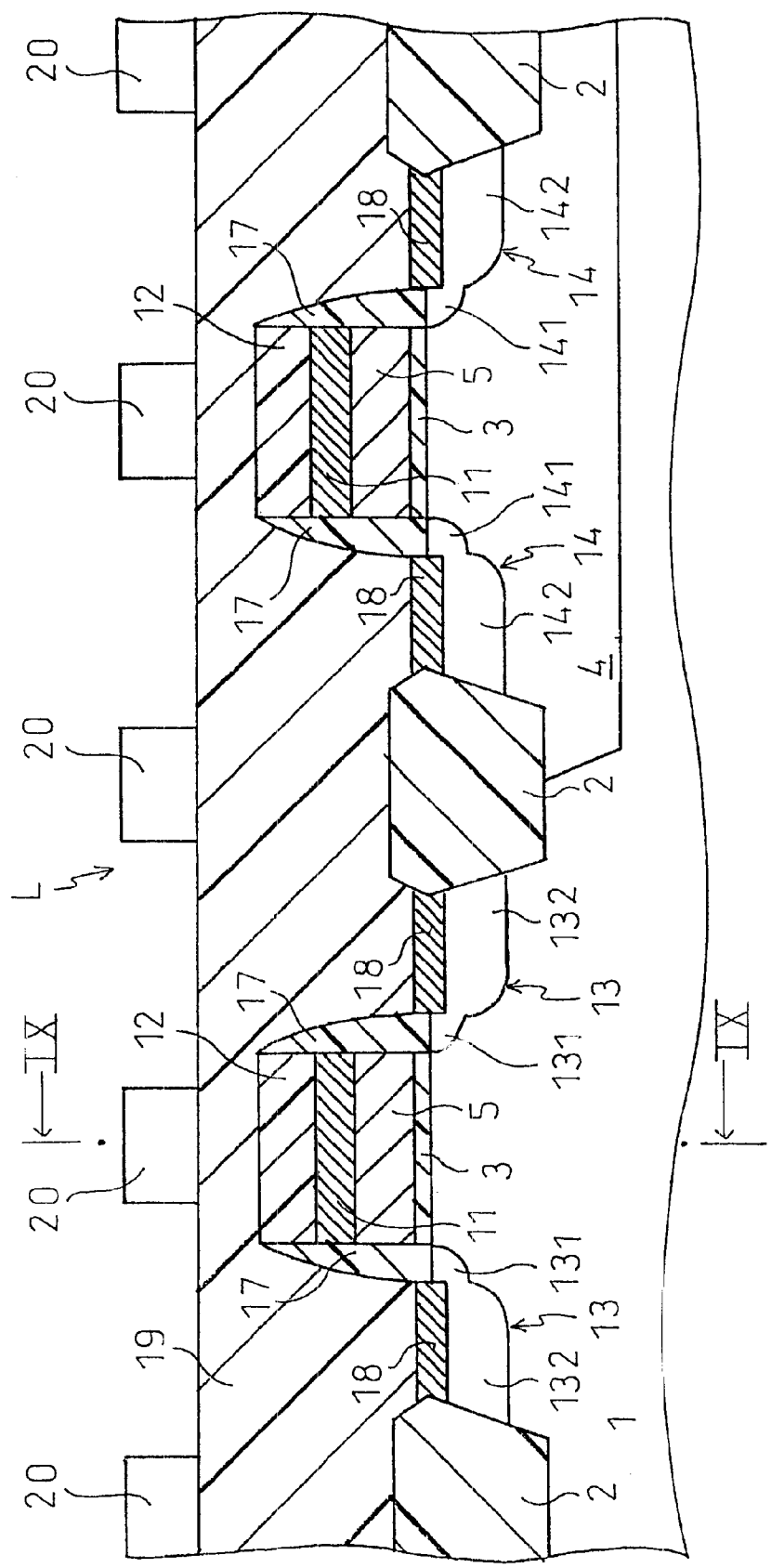
FIG. 9a1

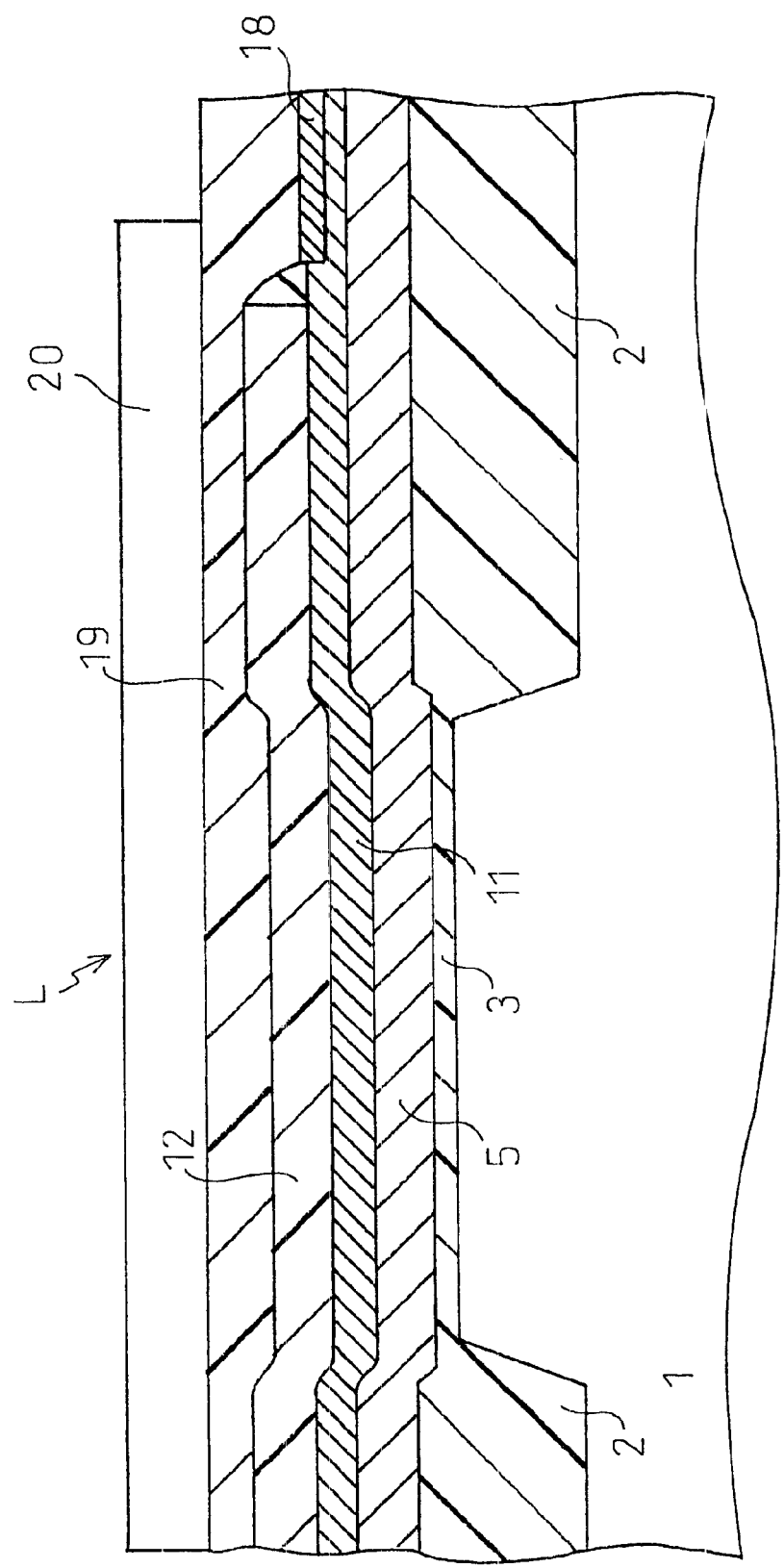
FIG. 9a2

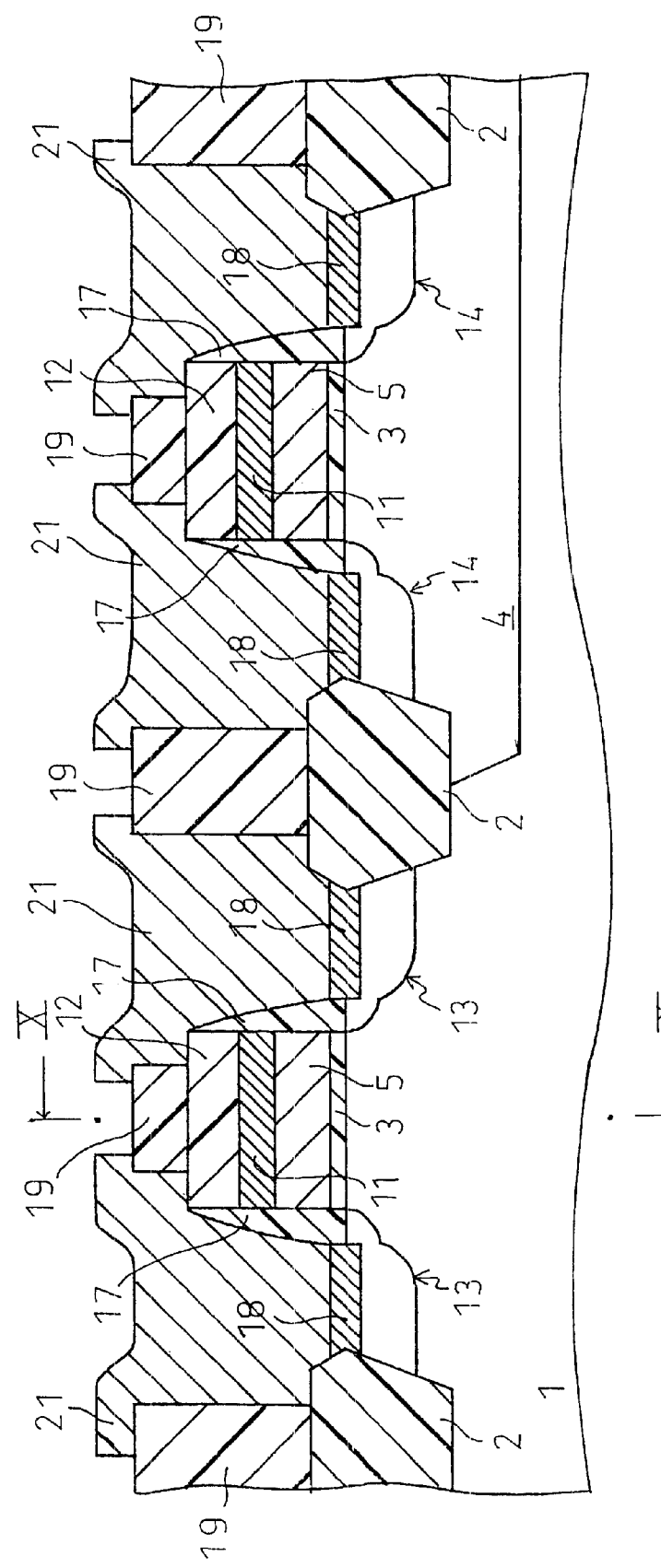
FIG.10a1

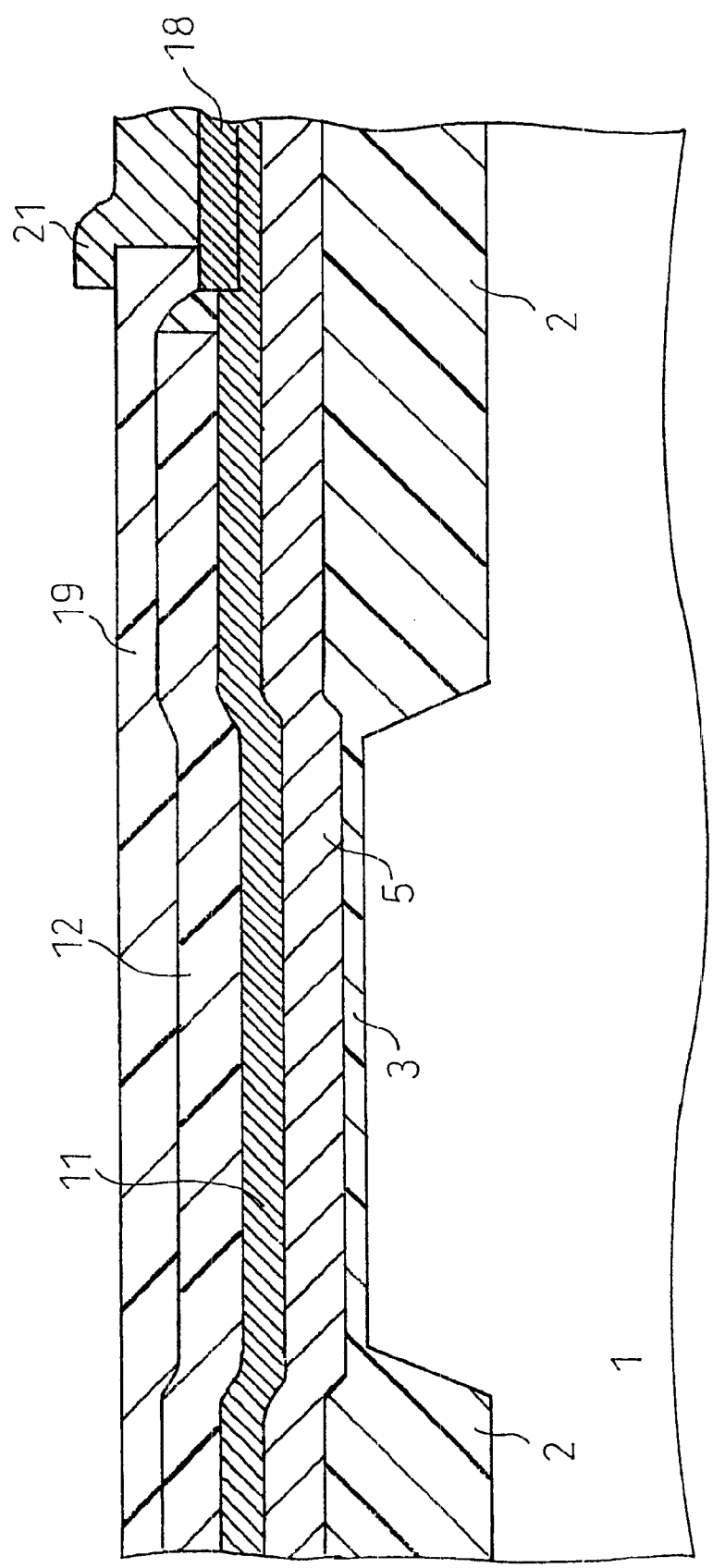
FIG.10a2

MANUFACTURING PROCESS FOR THE INTEGRATION IN A SEMICONDUCTOR CHIP OF AN INTEGRATED CIRCUIT INCLUDING A HIGH-DENSITY INTEGRATED CIRCUIT COMPONENTS PORTION AND A HIGH-PERFORMANCE LOGIC INTEGRATED CIRCUIT COMPONENTS PORTION

TECHNICAL FIELD

The present invention relates generally to the field of integrated circuit technology, and more specifically to the manufacturing of high-density integrated circuits, typically semiconductor memories, particularly but not exclusively non-volatile ones, and logic circuits. Still more specifically, the invention relates to a manufacturing process for the integration in same chip of a high-density integrated circuit portion, typically a memory, and high-performance logic integrated circuit portion.

BACKGROUND OF THE INVENTION

As known, in a semiconductor memory the most of the chip area is occupied by the array of memory cells, the so-called memory matrix. Thus, in order to keep the chip dimensions small enough while the number of memory cells increases, the dimensions of the memory cells have to be shrunk, so as to pack more and more memory cells per chip unit area.

However, one of the factors that limits the possibility of shrinking the memory cells' dimensions is the possibility of reducing the dimensions of the contacts. In a memory matrix, a large number of contacts are provided, e.g,. for contacting the memory cells' drain regions by the metal bit lines. Current memory chips can have several tens of millions of contacts.

The reason why the contact dimensions cannot be easily shrunk is mainly lithographic, and gives rise to an increased defectivity, that is, a low production yield.

In recent years, several new techniques of forming contacts have been proposed, in the attempt to shrink the contact dimensions without increasing the defectivity of the memory chips. One of such new techniques is the so-called Self-Aligned Contact (shortly, SAC) technique, in which by using an anisotropic etch non-conductive layers are advantageously used to relax the contact mask design rules.

However, new difficulties now arise in view of the trend towards the integration in a same semiconductor chip of a semiconductor memory and high-performance logic circuits, for the reasons to be explained.

Conventionally, high-performance logic circuits take advantage of another technique, known as salicidation, or self-aligned silicidation, providing for a self-aligned formation of metal suicides on active areas and on polysilicon layers. The use of salicidation has made possible higher circuit performance.

Thus, the general practice now provides for using the SAC technique for the fabrication of semiconductor memories, and salicidation for the production of high-performance logic circuits.

Unfortunately, the above two techniques are scarcely compatible. This prevents or makes difficult the integration in a same chip of a memory and high-performance logic circuits.

SUMMARY OF THE INVENTION

An embodiment of the present invention provides a manufacturing process suitable for integrating in a same semiconductor chip a high-density integrated circuit portion and a high-performance logic integrated circuit portion.

The process includes:

over a semiconductor substrate, insulatively placing a silicidated polysilicon layer, comprising a polysilicon layer selectively doped in accordance to a conductivity type of at least the high-performance logic integrated circuit components, covered by a silicide layer;

selectively covering the silicidated polysilicon layer with a hard mask;

defining gate structures for the high-density integrated circuit components and for the high-performance logic integrated circuit components using said hard mask, the gate structures comprising the silicidated polysilicon layer covered with the hard mask; and in a dielectric layer formed over the chip, forming contact openings for electrically contacting the high-density integrated circuit components and the high-performance logic integrated circuit components, wherein at least the contact openings for electrically contacting the high-density integrated circuit components are formed in self-alignment with the gate structures thereof.

BRIEF DESCRIPTION OF THE DRAWINGS

The features and advantages of the present invention will be made clearer by the following detailed description of a possible practical embodiment thereof, illustrated merely by way of a non-limiting example in the annexed drawings wherein:

FIGS. 1A, 2, 3, 4A, 5A, 6A, 7, 8A, 9A1, 9A2, 10A1 and 10A2 schematically show in cross-sectional views a sequence of the main steps of a process according to the present invention for the manufacturing of transistors of a high-performance logic circuit; and FIGS. 1B, 4B, 5B, 6B, 8B, 9B, and 10B schematically show in cross-sectional views a corresponding sequence of the main process steps for the manufacturing of a memory according to an embodiment of the invention.

DETAILED DESCRIPTION OF THE INVENTION

Figure 7:
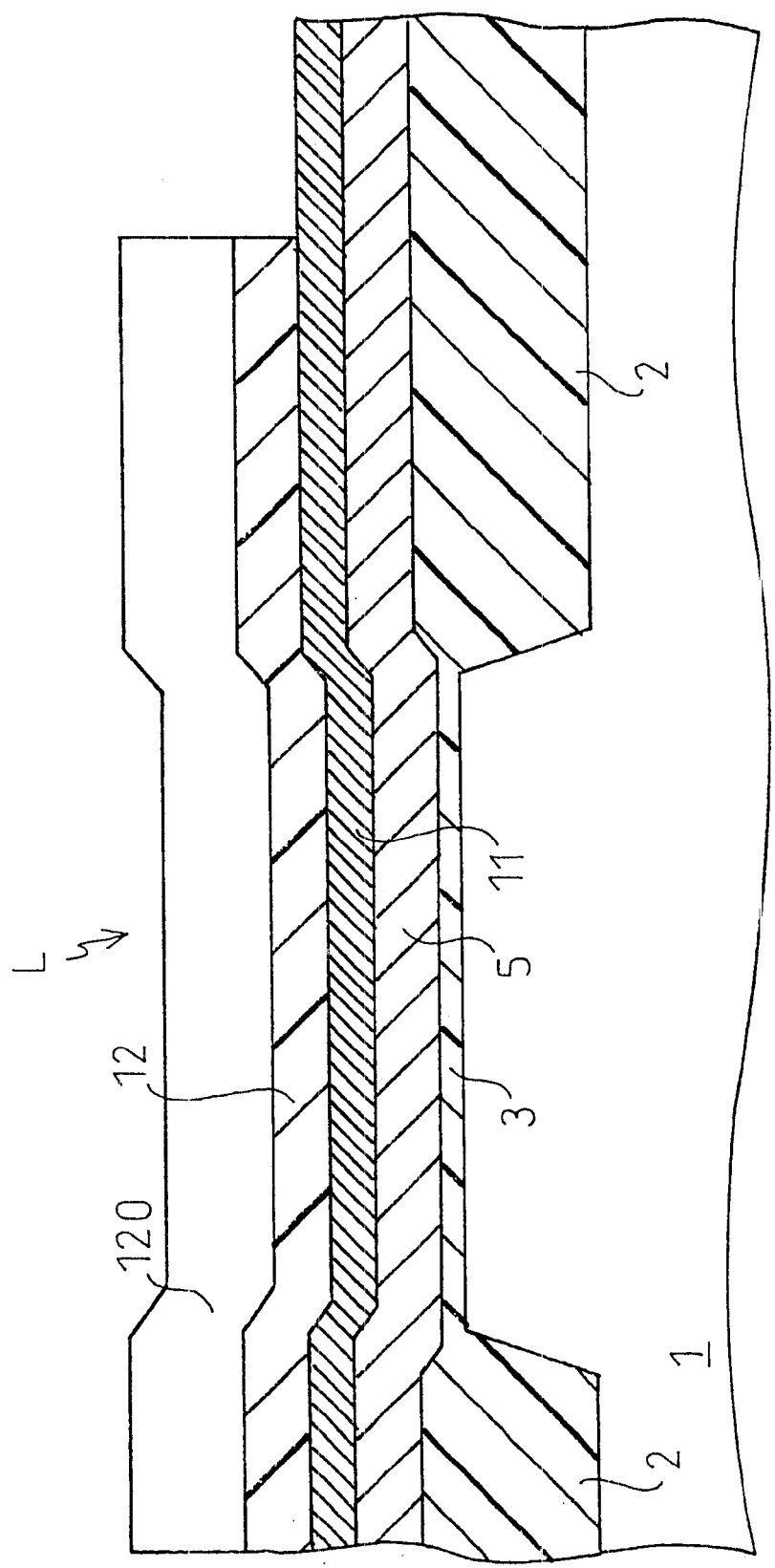

Making reference to the drawings, FIGS. 1A and 1B schematically show in cross-section a first portion L and, respectively, a second portion M of a semiconductor chip in which high-performance logic circuits and a semiconductor memory will be integrated. The first portion L of the chip will host a pair of complementary transistors of a high-performance logic circuit, while the second portion M will host a pair of memory cells of a memory cell matrix for a semiconductor memory, particularly a non-volatile memory such as an EPROM, an EEPROM or a Flash EEPROM.

Referring to FIG. 1A, in a semiconductor substrate 1, for example of the P conductivity type, with suitable doping level, field oxide regions 2 are selectively formed in any conventional way, e.g., by means of the so-called LOCOS technique. Between the field oxide regions 2, a logic transistor gate oxide layer 3 is formed over a surface of the substrate 1. The thickness of the logic transistor gate oxide layer 3 is for example in the range 20–100 Å. From the logic transistor gate oxide layer 3, gate oxides of the transistors of the high-performance logic circuit will be formed.

For the formation of P-channel transistors of the high-performance logic circuit, N type wells 4 are formed in the P type substrate 1. N-channel transistors of the high-performance logic circuit can be formed directly in the P type substrate 1 or, if preferred, P type wells with suitable doping can be formed in the P type substrate 1. It is to be noted that the conductivity type of the substrate 1, and thus that of the well 4, can be opposite to those previously described.

A polysilicon layer 5 is deposited over the field oxide regions 2 and the gate oxide layer 3.

Referring now to FIG. 1B, i.e., to the portion of the chip dedicated to the memory matrix, over the substrate 1 a memory cell gate oxide layer 6 is formed. From the memory cell oxide layer 6 gate oxides for the memory cells will be obtained. The oxide layer 6 can be the logic transistor gate oxide layer 3 or a different oxide layer, depending on the type of memory cells which are to be formed (EPROM, EEPROM, Flash EEPROM). The thickness of the memory cell gate oxide layer 6 is for example in the range 70–120 Å.

Over the memory cell gate oxide layer 6 a polysilicon layer 7 is deposited. The polysilicon layer 7 is a first, lower polysilicon layer (first poly), while the polysilicon layer 5 previously mentioned is a second, upper polysilicon layer (second poly). The first polysilicon layer 7 will be used to form floating gates of the memory cells. Over the first polysilicon layer 7, a dielectric layer 8 (interpoly dielectric) is formed. Typically, the interpoly dielectric is formed as a triple layer comprised of a lower oxide layer, an intermediate nitride layer, and an upper oxide layer (Oxide-Nitride-Oxide or ONO).

The second polysilicon layer 5, which in the portion L of the chip is deposited directly over the logic transistor gate oxide layer 3, is here deposited over the interpoly dielectric layer 8. The second polysilicon layer 5 will form the control gates of the memory cells.

The process steps necessary to form the structures depicted in FIGS. 1A and 1B can be completely conventional, and for this reason will not be described in further detail. Starting from these structures, the second polysilicon layer 5 is then submitted to selective doping to reduce the resistivity thereof. Preferably, at least as far as the transistors of the high-performance logic circuit are concerned, the portions of the polysilicon layer 5 which will have to form the gates of N-channel transistors are doped with N type dopants, while the portions of the polysilicon layer 5 that will have to form the gates of the P-channel transistors are doped with P type dopants. To this end, two distinct masks are used: a first mask, indicated as 9 in FIG. 2, is used to expose the portions of the polysilicon layer 5 that, after definition, will form the gates of N-channel transistors of the high-performance logic circuit, protecting from dopant implantation at least the portions of polysilicon layer 5 which will form the gates of the P-channel transistors of the high-performance logic circuit; the same mask 9 can also leave exposed the portions of the polysilicon layer 5 which will form the control gates of the memory cells. A suitable N type dopant, such as As or P in a dose of $5*10^{14}$ to $5*10^{15}$, is then implanted into the exposed portions of the polysilicon layer 5, that is the portions from which the gates of the N-channel transistors of the high-performance logic circuit will be formed, and optionally the portions from which the control gates of the memory cells will be formed.

Then, the first mask 9 is removed, and a second mask, indicated as 10 in FIG. 3, is applied to expose the portions of the polysilicon layer 5 that, after definition, will form the gates of the P-channel transistors of the high-performance logic circuit, protecting the remaining portions of the polysilicon layer 5 (that is, the portions of the polysilicon layer 5 previously doped, and those which will form the control gates of the memory cells). A suitable P type dopant, such as B or $BF_2$ in a dose of $5*10^{14}$ to $5*10^{15}$, is then implanted into the exposed portions of the polysilicon layer 5. Then, also the second mask 10 is removed.

Referring now to FIGS. 4A and 4B, a metal silicide layer 11, e.g., $WSi_2$, is then formed over the polysilicon layer 5 to further increase the conductivity thereof. To this end, a layer of a suitable metal, such as W, is first deposited over the polysilicon layer 5; then, by means of a suitable thermal treatment, the metal atoms are made to react with the silicon atoms in the polysilicon layer 5 so as to form the silicide layer 11. The silicide layer 11, also called polycide, is formed over the whole of the polysilicon layer 5, that is both over the portions of the polysilicon layer 5 that will form the gates of the N-channel and P-channel transistors of the high-performance logic circuit (FIG. 4A), and over the portions of the polysilicon layer 5 which will form the control gates of the memory cells (FIG. 4B). It is worth remarking that the polysilicon layer 5 is silicidated before the patterning thereof.

Then, referring to FIGS. 5A and 5B, a dielectric layer 12 such as a nitride layer is formed over the silicide layer 11, typically by deposition. Such a dielectric layer 12 will be used to form a so-called hard mask for the definition (patterning) of the polysilicon layer 5. Provision of a hard mask is advantageous in the definition of sub-micrometric geometries in polysilicon layers, thanks to the fact that it increases the degree of reflectivity of the structure to be defined. After deposition of the dielectric layer 12, a photoresist layer is deposited over the chip, then by means of a photolithographic mask the photoresist layer is selectively exposed to light, it is developed to selectively remove it, and then a selective etch is carried out. By means of the etching process, the dielectric layer 12 is selectively removed, thus forming a hard mask that leaves exposed the portions of the polysilicon layer 5 which will have to be removed in the following steps.

Then, using the remaining dielectric layer 12 as a hard mask, another selective etch is carried out, to define by selective removal the polysilicon layer 5, together with the silicide layer 11, as well as the underlying layers such as, in the high-performance logic circuit region, the logic transistor gate oxide layer 3, and in the memory matrix region the interpoly dielectric 8. A following masking step will allow the etching of the first polysilicon layer 7 and the memory cell gate oxide layer 6. At the end of this etch, conventional implants are performed in order to form memory cell source and drain regions 15, 16. In this way, the gate structures shown in FIGS. 6A and 6B are obtained.

At this point it is possible to selectively remove the dielectric layer 12 from over the polysilicon layer 5 where it is desired to provide contacts to the polysilicon layer 5. For example, as shown in FIG. 7 which is a view in cross-section of the N-channel transistor of the high-performance logic circuit along line VII—VII in FIG. 6A, a resist mask 120 covers all the chip surface, except from regions of the dielectric layer 12 which are to be removed to allow access to the underlying polysilicon layer 5; preferably, such regions are located over the field oxide 2. The dielectric layer 12 is then etched away from the exposed regions, so as to expose the surface of the polysilicon layer 5.

The following process steps provide for the formation, in conventional ways, of source regions and drain regions 13 and 14 for the N-channel and, respectively, P-channel transistors of the high-performance logic circuit. The source and drain regions 13 and 14 of the transistors of the high-performance logic circuit have the so-called Lightly-Doped Drain (LDD) structure, with a shallower, relatively lightly doped portion 131, 141 aside the gate structures, and a deeper, more heavily doped portion 132, 142 farther from the gate structures. Such a structure is obtained by firstly introducing into the substrate, in self alignment with the gate structures of the transistors, a relatively light dose of dopants, then forming insulating material sidewall spacers 17 at the sides of the gate structures, extending down to the substrate surface so as to cover the lightly doped portions 131, 141 of the source and drain regions 13, 14, and then forming the deeper, more heavily doped portions 132, 142 of the source and drain regions. Sidewall spacers 17 are also inherently formed at the sides of the gate structures of the memory cells.

Figure 8A:
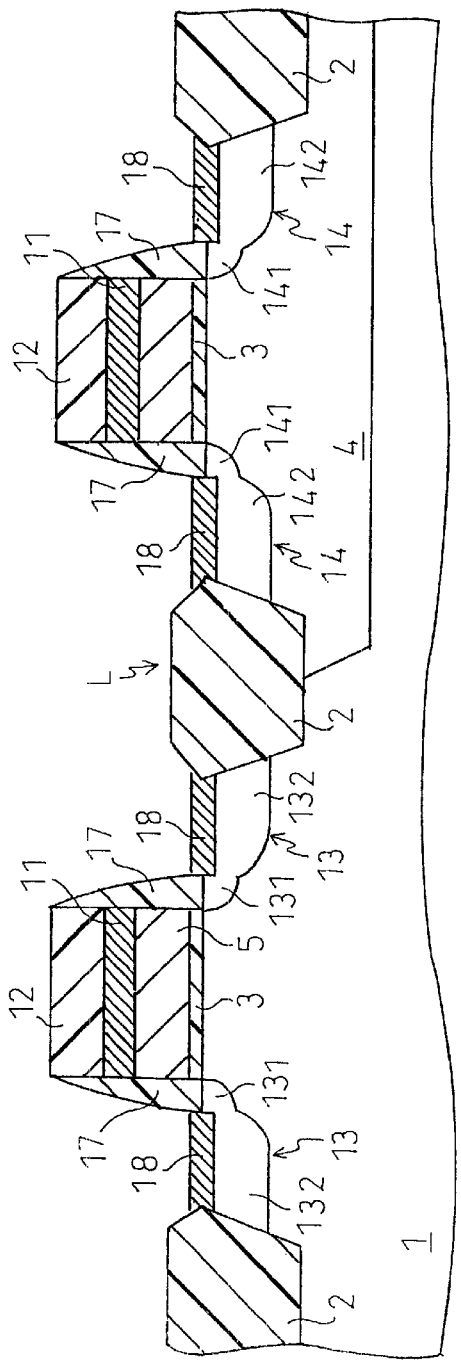
Figure 8B:
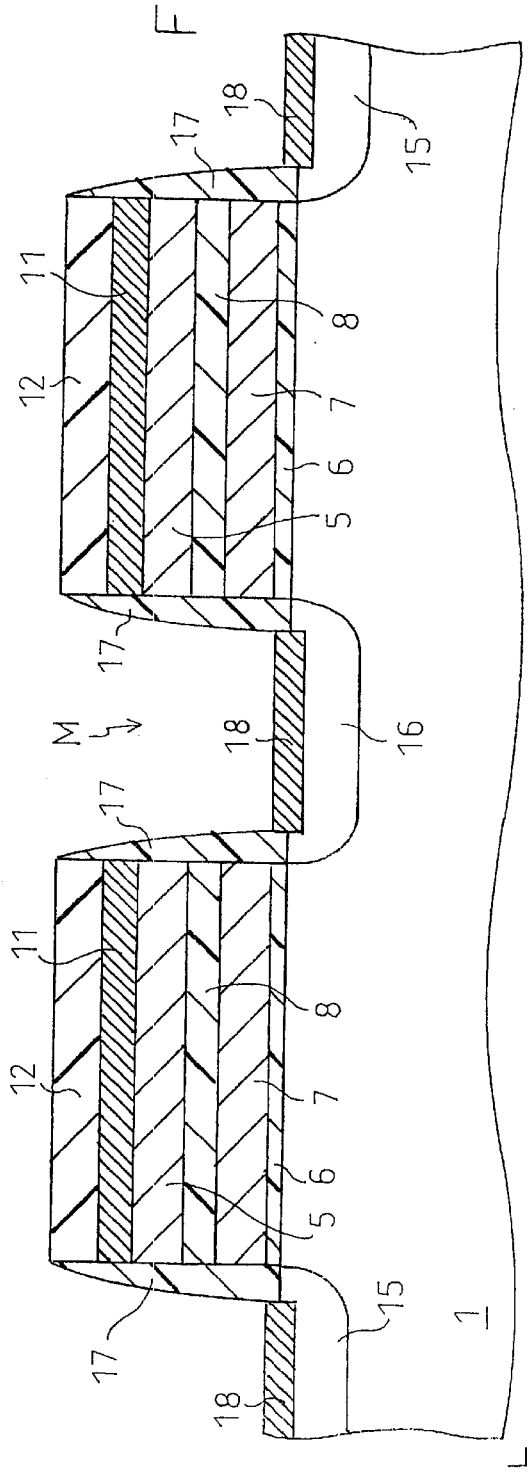
Figure 9B:
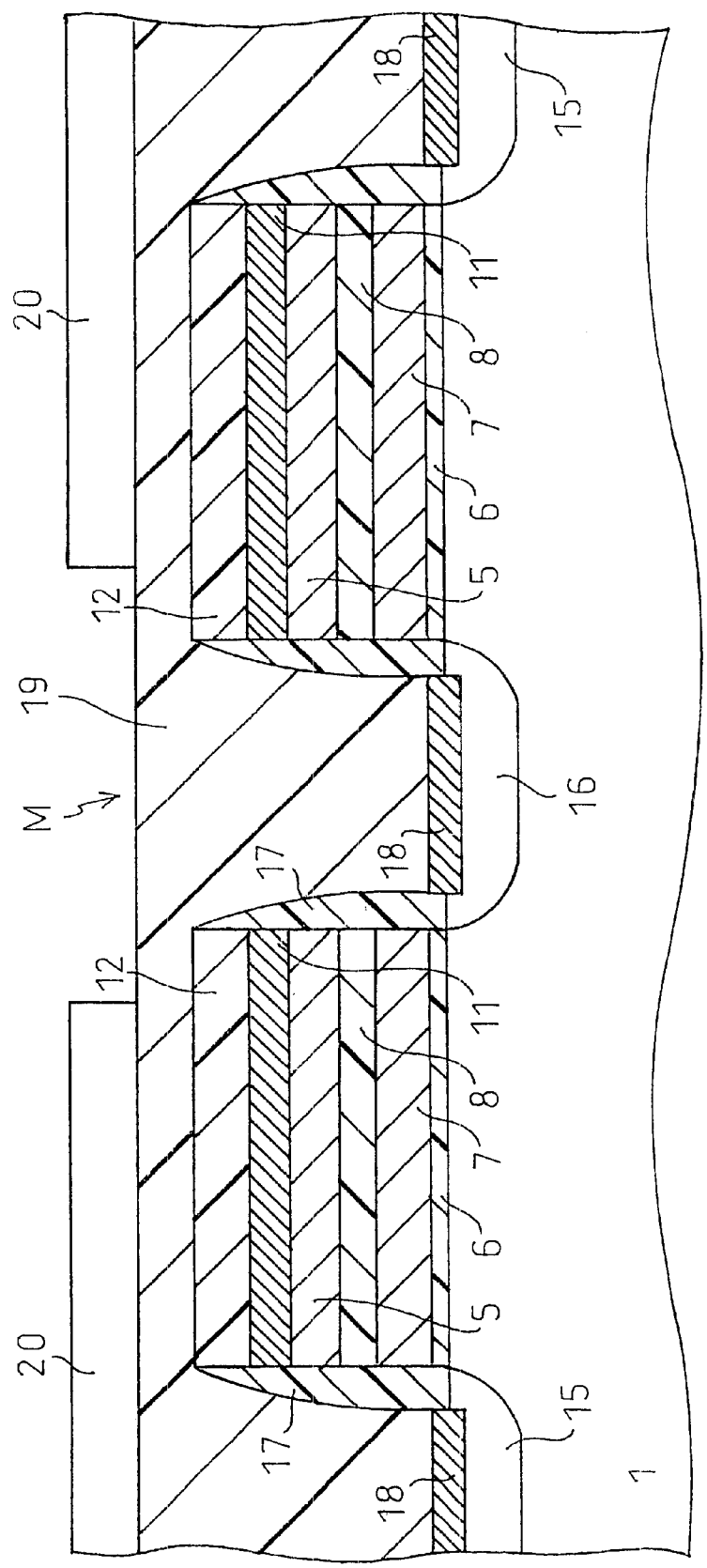

Salicidation of the active areas is also contemplated: to this end, a layer of a suitable metal such as Ti or Co is firstly deposited over the whole surface of the chip, then a thermal treatment is carried out; during the thermal treatment, the metal atoms react with silicon atoms to form a metal silicide; this only takes place where the metal atoms lies directly over silicon or polysilicon, while over the dielectric layers and the sidewall spacers no reaction takes place and no silicide is formed. At the end of the thermal treatment, the unreacted metal atoms are removed: self-aligned metal silicide, or salicide, regions 18 are thus formed over the deeper, more heavily doped portions 132, 142 of the source and drain regions 13, 14 of the transistors, and over the source and drain regions 15, 16 of the memory cells (FIGS. 8A and 8B). It is to be noted that salicide regions 18 are not formed over the polysilicon layer 5, since the latter is covered by the dielectric hard mask 12, except where the polysilicon layer 5 is not covered by the dielectric layer 12, i.e., where contacts to the polysilicon layer 5 (FIG. 9A2). The fact that the polysilicon layer 5 is not salicidated is not a problem, and does not affect the performance of the logic circuit. In fact, as shown in FIGS. 4A, 4B, the polysilicon layer 5 has previously been submitted to a blank silicidation and the polycide layer 11 has been formed over the polysilicon layer 5. The electric performance of the polycide layer 11 are substantially equivalent to those of a salicide layer. In addition, the formation of salicide regions 18 where contacts to the polysilicon layer 5 are to be formed improves the contact conductivity.

After these steps, referring to FIGS. 9A1, 9A2 (which is a cross-section along line IX—IX in FIG. 9A1) and 9B, the structure is ready to receive by deposition a dielectric layer 19, in which contact openings will formed. In order to define contact openings, a mask 20 (contact mask) is applied to the dielectric layer 19, the mask 20 leaving exposed the portions of the dielectric layer 19 that will have to be removed so as to open contact openings. It is to be noted that the openings in the contact mask 20 extend over the gate structures of the memory cells, and possibly also over the gate structures of the transistors of the high-performance logic circuit. In other words, the contact openings to be opened in the dielectric layer are defined in self-alignment with the gate structures of the memory cells and, possibly, also of the transistors of the high-performance logic circuit. However, this is not a concern, since during the following selective etch to remove the dielectric layer 19, such gate structures are not damaged, due to the presence of the hard mask layer 12 and the sidewall spacers 17 that protect the polysilicon layer 5.

Figure 10B:
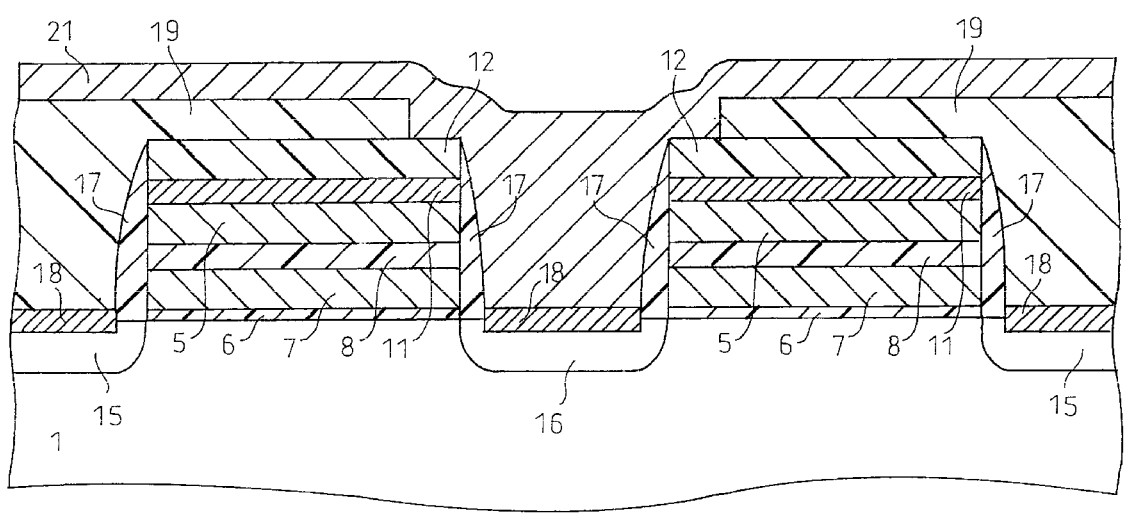

Referring to FIGS. 10A1, 10A2 (which is a cross-section along line X—X in FIG. 10A1) and 10B, after having defined contact openings in the dielectric layer 19, a metal layer 21 is deposited over the chip; the metal layer 21 penetrates into the contact openings thus contacting, through the respective salicide regions 18, the source and drain regions 13, 14 and the gate of the transistors of the high performance logic circuit, and the drain regions 16 of the memory cells. Similar contacts to the source regions 15 of the memory cells, not shown, will clearly be provided for in selected regions of the memory matrix. The metal layer 21 is then patterned to define metal strips.

The process described above is suitable for the integration in a same chip of a high-performance logic circuit and a memory, particularly a non-volatile one.

The process described above allows one to take advantage of the techniques of salicidation of active areas, from one hand, and Self-Aligned Contact (SAC) formation from the other hand: the first technique increases the performance of logic circuits, by reducing the resistivity of the source and drain regions of the transistors, while the second technique forms compact arrays of a memory cells.

The process described above allows one to adopt the SAC technique without preventing the possibility of forming highly conductive, properly doped gate structures for the transistors of the high-performance logic circuit and the memory cells. This result is achieved by submitting the polysilicon layer from which the gates of the transistors, and the control gates of the memory cells are formed to a proper doping to achieve the correct work function, and to a blank silicidation before the definition of the gate structures. The silicidated polysilicon layer is then protected by a hard mask, which will protect the gate structures during formation of contact openings; in this way, it is possible to have contact openings extending over the gate structures of the memory cells without the risk of damaging the gate structures themselves.

It is to be noted that the steps of properly doping, with N type and P type dopants, the polysilicon layer 5 do not necessarily have to be performed before silicidation thereof; as an alternative, the polysilicon layer 5 can be submitted to the required doping even after the blank formation of the silicide layer 6.

Even if not explicitly shown in the previous description, the process allows one to integrate, together with a memory and high-performance logic circuits, transistors capable of handling a relatively high voltage, higher than the operating voltage of the high performance logic circuits. Such transistors, called high voltage (HV) transistors, could be necessary for the memory, for example in order to perform electrical modification of the content thereof. HV transistors can have a structure similar to that of the transistors of the high performance logic circuits, except for a thicker gate oxide, which provides the HV transistors with higher than normal breakdown voltages.

While the invention has been particularly shown and described with reference to a preferred embodiment thereof, it will be understood by those skilled in the art that various changes in form and details may be made without departing from the scope of the invention, defined in the appended claims.

For example, the specific gate structure of the memory cells is unessential, depending solely on the specific kind of memory to be integrated. A memory with single polysilicon level memory cells can for example be fabricated using the process of the invention.

The process according to the present invention is equally not limited to the integration of non-volatile memories, being more generally suitable for the integration of any kind of semiconductor memory.

Still more generally, the process according to the invention is suitable for the integration in a semiconductor chip of an integrated circuit including a high-density integrated circuit components portion and a high-performance logic integrated circuit components portion.

What is claimed is:

1. A process for the integration in a semiconductor chip of an integrated circuit including a high-density integrated circuit components portion and a high-performance logic integrated circuit components portion, the process comprising:

over a semiconductor substrate, insulatively forming a silicidated polysilicon layer that includes a polysilicon layer selectively doped in accordance with a conductivity type of the high-performance logic integrated circuit components and covered by a silicide layer;

selectively covering the silicidated polysilicon layer with a hard mask;

defining gate structures for the high-density integrated circuit components and for the high-performance logic integrated circuit components using said hard mask, the gate structures comprising the silicidated polysilicon layer covered with the hard mask; and in a dielectric layer formed over the chip, forming contact openings for electrically contacting the high-density integrated circuit components and the high-performance logic integrated circuit components, wherein at least the contact openings for electrically contacting the high-density integrated circuit components are formed in self-alignment with the gate structures thereof.

2. The process according to claim 1, for the integration in a same semiconductor chip of a memory and high-performance logic circuits, the gate structures for the high-density integrated circuit components being gate structures for memory cells of the memory and the gate structures for the high-performance logic integrated circuit components being gate structures for transistors of the high-performance logic circuits, the process further comprising:

selectively doping first portions of the polysilicon layer, from which gate structures for N-channel transistors of the high-performance logic circuits will be obtained, with N type dopants;

selectively doping second portions of the polysilicon layer, from which gate structures for P-channel transistors of the high-performance logic circuits will be obtained, with P type dopants;

forming source and drain regions for memory cells of the memory and for the transistors of the high-performance logic circuits;

forming insulating material sidewall spacers aside said gate structures;

salicidating at least the source and drain regions of the transistors of the high-performance logic circuits; and forming contact openings in the dielectric layer for electrically contacting the memory cells and the transistors of the high-performance logic circuits, at least the contact openings for electrically contacting the memory cells extending over the gate structures of the memory cells.

3. The process according to claim 2, in which forming the silicidated polysilicon layer includes depositing metal atoms over the whole polysilicon layer, and submitting the chip to a thermal treatment to make the metal atoms react with the silicon atoms of the polysilicon layer, so as to obtain the silicide layer which covers the whole polysilicon layer.

4. The process according to claim 3, in which said metal atoms are atoms of tungsten.

5. The process according to claim 2, in which said steps of selectively doping the first portions and the second portions of the polysilicon layer are performed before silicidating the polysilicon layer to form the silicide layer.

6. The process according to claim 2, in which said steps of selectively doping the first portions and the second portions of the polysilicon layer are performed after silicidating the polysilicon layer, but before selectively covering the silicidated polysilicon layer with the hard mask.

7. The process according to claim 5, in which said selectively covering the silicidated polysilicon layer with a hard mask provides for covering the silicidated polysilicon layer with a nitride layer, and selectively removing the nitride layer.

8. The process according to claim 2, in which also the source and drain regions of the memory cells are salicidated.

9. The process according to claim 8, in which said forming source and drain regions for the transistors of the high-performance logic circuits provides for forming first source and drain region portions aside the gate structures of the transistors of the high-performance logic circuits, and second source and drain region portions farther from the gate structures, the first source and drain region portions being lightly doped and shallow compared to the second source and drain region portions.

10. The process according to claim 9, in which the sidewall spacers cover the first source and drain region portions.

11. The process according to claim 10, in which said salicidation of the source and drain regions is, for the transistors of the high-performance logic circuits, a salicidation of the second source and drain region portions.

12. The process according to claim 11, in which said salicidation of the source and drain regions provides for depositing a layer of metal atoms, and submitting the chip to a thermal treatment, so that where the layer of metal atoms overlies the source and drain regions the metal atoms react with the semiconductor atoms to form salicide regions, and then removing from the chip unreacted metal atoms of the layer of metal atoms.

13. The process according to claim 2, in which also the contact openings for electrically contacting the transistors of the high-performance logic circuits extend over the gate structures of the transistors.

14. The process according to claim 2, in which in order to electrically contact the silicidated polysilicon layer the hard mask layer is selectively removed from over the silicidated polysilicon layer where electrical contacts thereto are to be formed, before the forming of the dielectric layer, and then contact openings are formed in the dielectric layer for electrically contacting the silicidated polysilicon layer.

15. The process according to claim 13, in which electrical contacts to the silicidated polysilicon layer are formed in regions of the chip where the silicidated polysilicon layer lies over thick oxide regions.

16. An integrated circuit, comprising: integrated in a same semiconductor chip, a high-density integrated circuit components portion and a high-performance logic integrated circuit components portion, wherein the high-density integrated circuit components and the high-performance logic integrated circuit components each include:

a gate structure having silicidated polysilicon layer that includes a polysilicon layer, selectively doped in accordance to a conductivity type of the high-performance logic integrated circuit components, covered by a silicide layer, the silicidated polysilicon layer being protected by a hard mask;

a dielectric layer formed over the hard mask and having a contact opening extending through the dielectric layer laterally of, and above, the gate structure; and a contact for electrically contacting the high-density integrated circuit components and the high-performance logic integrated circuit components, wherein the contact is positioned in the contact opening laterally of the gate structure and extends over and contacts the hard mask at a contact point above the gate structure for electrically contacting the high-density integrated circuit components and wherein the contact is self-aligned with the gate structures.

17. A process for integrating in a semiconductor chip of an integrated circuit including a high-density integrated circuit components portion and a high-performance logic integrated circuit components portion, the process comprising the steps of:

forming a silicidated polysilicon layer on the semiconductor chip that includes a polysilicon layer selectively doped in accordance with a conductivity type of the high-performance logic integrated circuit components and covered by a silicide layer;

depositing a hard mask to cover the silicidated polysilicon layer;

defining gate structures for the high-density integrated circuit components and for the high-performance logic integrated circuit components using said hard mask, the gate structures comprising the silicidated polysilicon layer covered with the hard mask;

depositing a dielectric layer; and forming contacts in the dielectric layer for electrically contacting the high-density integrated circuit components, wherein the contact is positioned laterally of the gate structure of the high-density integrated circuit components and extends over and contacts the hard mask at a contact point above the gate structure of the high-density integrated circuit components for electrically contacting the high-density integrated circuit components and wherein the contact is self-aligned with the gate structures of the high density integrated circuit components.

18. The process according to claim 17, for integrating in a same semiconductor chip of a memory and high-performance logic circuits, the gate structures for the high-density integrated circuit components being gate structures for memory cells of the memory and the gate structures for the high-performance logic integrated circuit components being gate structures for transistors of the high-performance logic circuits, the process further comprising the steps of:

selectively doping first portions of the polysilicon layer, from which gate structures for N-channel transistors of the high-performance logic circuits will be obtained, with N type dopants;

selectively doping second portions of the polysilicon layer, from which gate structures for P-channel transistors of the high-performance logic circuits will be obtained, with P type dopants;

forming source and drain regions for memory cells of the memory and for the transistors of the high-performance logic circuits;

forming insulating material sidewall spacers aside said gate structures;

salicidating the source and drain regions of the transistors of the high-performance logic circuits;

forming a dielectric layer over the semiconductor chip;

forming contact openings in the dielectric layer thereby exposing a region of the hard mask; and forming contacts in the dielectric layer for electrically contacting the high-density integrated circuit components, wherein the contact is positioned laterally of the gate structure and extends over and contacts the gate structure the hard mask at a contact point above the gate structure for electrically contacting the high-density integrated circuit components and wherein the contact is self-aligned with the gate structures of the high-density circuit components.

19. The process according to claim 18, in which forming the silicated polysilicon layer includes depositing metal atoms over the whole polysilicon layer, and submitting the chip to a thermal treatment to make the metal atoms react with the silicon atoms of the polysilicon layer, so as to obtain the silicide layer which covers the whole polysilicon layer.

* * * * *